April 9, 1957
L. MOLES
2,788,432
CONTINUOUS FUSION FURNACE
Filed May 19, 1955
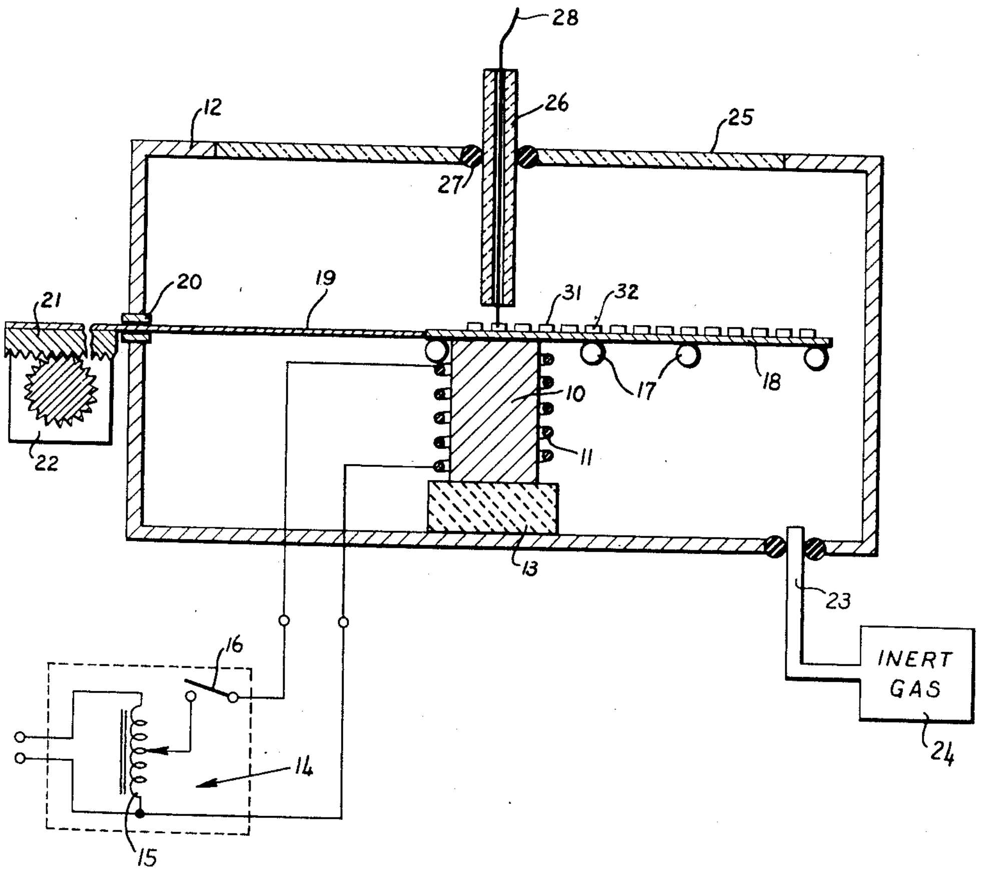
INVENTOR
LESLIE MOLES
BY Henry Heyman
ATTORNEY United States Patent Office 2,788,432
Patented Apr. 9, 1957

2,788,432

CONTINUOUS FUSION FURNACE

Leslie Moles, Los Angeles, Calif., assignor to Hughes Aircraft Company, Culver City, Calif., a corporation of Delaware Application May 19, 1955, Serial No. 509,473

5 Claims. (Cl. 219—85)

The present invention relates to an improved apparatus for producing semiconductor devices and, more particularly, to an apparatus for producing fused junction semiconductor crystal bodies.

In the semiconductor art, a region of semiconductor material containing an excess of donor impurities and having an excess of free electrons is considered to be an N-type region while a P-type region is one containing an excess of acceptor impurities resulting in a deficit of electrons or, stated differently, an excess of holes. When a continuous solid specimen of semiconductor crystal material has an N-type region adjacent a P-type region, the boundary between the two regions is termed a P–N or N–P junction and the specimen of semiconductor material is termed a P–N junction semiconductor device. Such a P–N junction device may be used as a rectifier. A specimen having two N-type regions separated by a P-type region, for example, is termed an N–P–N junction semiconductor device or transistor, while a specimen having two P-type regions separated by an N-type region is termed a P–N–P junction semiconductor device or transistor.

The term, "monatomic semiconductor crystal," as utilized herein, is considered generic to both germanium and silicon, and is employed to distinguish these semiconductors from metallic oxide semiconductors, such as copper oxide and other semiconductors consisting essentially of chemical compounds.

The term, "active impurity," is used to denote those impurities which affect the electrical characteristics of monatomic semiconductor crystals, as distinguishable from other impurities which have no appreciable effect on these characteristics. Active impurities are ordinarily classified either as donor impurities—such as phosphorus, arsenic, and antimony—or as acceptor impurities, such as boron, aluminum, gallium, and indium.

The term, "solvent metal," is used in this specification to describe those materials which, when in the liquid state, become solvents for the semiconductor material which is under consideration and will therefore dissolve areas of semiconductor material which are in contact with the solvent metal. A solvent metal may be either a primary element or an alloy.

In accordance with one method for preparing fused junction semiconductor devices, a fused P–N junction is produced at a surface of a monatomic semiconductor crystal body by placing a molten drop of solvent metal containing an active impurity, or a solvent metal which is an active impurity, such as aluminum, at the surface of a preheated semiconductor crystal body, such as silicon. The aluminum is deposited on the semiconductor crystal surface as a metallic pellet by raising the temperature of the semiconductor body and touching to the surface of the body a wire of solvent metal. The crystal body must be above the melting point of the solvent metal which is used, and upon contact of the solvent metal wire with the heated semiconductor body surface a small molten drop of solvent metal and active impurity is placed upon the surface. The molten drop of solvent metal dissolves a small portion of the crystcal body at or near the surface, forming an alloy solution. Ordinarily, the solvent metal which is used has a relatively low melting point or at least a low eutectic temperature with the semiconductor material, this being desirable so that fusion can be effected readily without raising the temperature of the crystal body to values which might injure the electrical characteristics of the crystal. To form the junction region, the assembly which comprises the crystal body and the molten solvent metal drop is allowed to cool.

As the temperature drops, the solubility of the dissolved semiconductor crystal material in the drop of solvent metal decreases and, as a result, some of the active impurity contained in the solvent metal specimen begins to precipitate out of the liquid metal solution, depositing preferentially on the parent crystal body to form a regrown crystal region of a predetermined conductivity type dependent upon the type of active impurity which is used. As the temperature further decreases, the remainder of the solvent metal and dissolved semiconductor material solidifies as an alloy button affixed to the regrown crystal region. By repeating the described process on the opposite surface of the semiconductor crystal body, a P–N–P or N–P–N fused junction transistor may be produced.

In producing fused junction semiconductor devices by the above described method, it has been necessary in the prior state of the art to perform a series of clearly defined steps which do not lend themselves readily to mass production techniques. For example, in the prior state of the art, one or more crystal bodies are simultaneously raised to a predetermined temperature, such as 700° C., and the solvent metal wire is brought into contact with the surface of each of the crystal bodies while they are maintained at the predetermined temperature. After a molten drop of solvent metal has been deposited on each crystal, the semiconductor bodies are cooled at a controlled rate to form the regrown crystal region. However, such a method has several inherent difficulties. Since the semiconductor bodies must be maintained at the elevated temperature until a drop of solvent metal is formed on each, it is necessary that they be maintained at this elevated temperature for a considerable length of time. Since the temperature is of the order of 700° C., the exposure of the crystal bodies to this elevated temperature often results in a lessening of, or a detrimental effect upon, the carrier lifetime of the semiconductor devices which are produced when silicon is used as the semiconductor crystal material. An inert atmosphere is especially necessary to avoid the formation of silicates upon the surface of the crystal. In the apparatus used in the prior state of the art, the maintenance of such an inert atmosphere is difficult since each crystal must be reached with the solvent metal wire. In addition, such a method using discrete steps is time-consuming, inasmuch as all of the crystal bodies must be raised to temperature, maintained at the temperature while the molten drop is formed, and thereafter cooled. In effect, by the method and apparatus of the prior art, there can be no overlap in the performance of the steps since each step must be performed simultaneously upon the total number of crystals being processed.

Accordingly, it is an object of the present invention to provide an apparatus for producing fused junction semiconductor devices which lends itself readily to mass production and automation.

It is another object of the present invention to provide an apparatus for producing fused junction semiconductor devices which does not require the exposure of the semiconductor crystal body to an elevated temperature for more than a minimum period of time.

It is another object of the present invention to provide an apparatus for producing fused junction semiconductor devices which requires a minimum of skill on the part of the operator of the apparatus.

It is a further object of the present invention to provide an apparatus for producing fused junction semiconductor devices with a greater degree of efficiency and cleanliness than has heretofore been possible in the prior state of the art.

It is a still further object of the present invention to provide an apparatus for producing fused junction semiconductor devices which allows an increased rate of production of semiconductor devices.

It is still another object of the present invention to provide an efficient, reliable, reproducible, economical, predictable apparatus for producing fused P–N junctions.

The apparatus of the present invention as adapted for producing a fused P–N junction upon the surface of a plurality of semiconductor crystal bodies, comprises means for producing a localized heating zone; means for transporting a plurality of semiconductor crystal bodies through the heating zone at a predetermined rate, whereby the semiconductor crystal bodies are preheated as they approach the localized heating zone, are maintained at a predetermined temperature as they proceed through the localized heating zone, and are cooled at a controlled rate as they move away from the heating zone; means for bringing a wire of solvent metal and active impurity into contact with the surface of the semiconductor crystal body while it is in the heating zone; and means for maintaining an inert atmosphere surrounding the semiconductor crystal bodies.

The novel features which are believed to be characteristic of the invention, both as to its organization and method of operation, together with further objects and advantages thereof, will be better understood from the following description considered in connection with the accompanying drawing, in which an embodiment of the invention is illustrated by way of example. It is to be expressly understood, however, that the drawing is for the purpose of illustration and description only and is not intended as a definition of the limits of the invention.

In the accompanying drawing, the single figure is a cross sectional view of the apparatus of the present invention in its presently preferred form, in which some of the components of the apparatus are shown schematically.

Referring to the drawing, the apparatus of the present invention comprises a heating core 10, which in the present embodiment is formed from graphite. Resistance heating coils 11 surround the graphite heating core 10 which is substantially rectangular in cross section in the presently preferred embodiment. The graphite heating core 10 is mounted upon, and spaced from the base of the housing 12 which encloses the apparatus by an insulative heat break 13 such as transite. A source of electrical power 14 is connected to the heating coil which surrounds the heating core in order to raise the heating core 10 to a predetermined temperature. The electrical power source 14 may include any conventional electrical circuit which is controllable for supplying a predetermined amount of electrical energy to the graphite heating core. For example, the power source includes an auto transformer, generally designated 15, which is connected across a 110-volt alternating-current source, as indicated, and to a switch 16 through which a potential output from the auto transformer may be applied to the heating core 10.

A holding tray 18, which is adapted to hold and position a plurality of semiconductor crystals, is mounted above the upper surface of the heating core in such manner that it is longitudinally movable with respect to the upper surface of the heating core 10. Since the crystal bodies are in contact with the holding tray 18 at an elevated temperature, it is necessary that the material from which the holding tray is formed is one which does not react with, or contaminate, the semiconductor crystal material. In the present embodiment, quartz has been found to be an excellent material for this purpose. The quartz holding tray 18 is mounted upon rollers 17 such that the lower surface of the tray is proximate to, or in sliding contact with, the upper surface of the graphite heating core 10, and is movable with respect to the heating core through a distance at least equal to the length of the holding tray. For purposes of clarity, the supports for the rollers 17 are not shown.

Means for moving the holding tray throughout the length of its travel at an accurately controllable rate are provided. In this embodiment a shaft 19, which is affixed to the holding tray 18 parallel to the direction of travel of the holding tray, extends through the side of the housing 12. O-ring 20 forms a seal around the shaft where it extends through the housing. Affixed to the outside end of the shaft 19 is a rack gear 21. An electric motor is connected to the rack gear through a reduction gear 22 in order that the tray 18 may be moved slowly at an accurately controllable rate. The length of the rack gear 21 and the length of travel of the holding tray are substantially equal to the length of the holding tray, since the entire length of the tray must be transported past the heating core 10. The rate at which the tray must be moved past the heating core in order to attain the proper temperature of the semiconductor crystal bodies in the area above the heating core may be readily determined by routine experiment of one skilled in the art. It will be apparent that the means for transporting the holding tray are illustrative only and that many modifications may be made by one skilled in the art.

The housing 12 surrounds the apparatus and is sufficient in size to permit full travel of the holding tray 18 past the heating core 10. The housing is substantially gastight, however, a port 23 is provided and a source of inert gas 24 which is controlled to maintain the housing at a slightly positive inert atmosphere is connected to the inlet port 23. A transparent insert 25 is provided in the housing to allow visual observation of the semiconductor crystal bodies which are moving past the heating core.

At least one guide tube 26 extends through the upper surface of the housing 12 and is positioned above the holding tray 18 in the area which is directly above the heating core 10. The guide tube 22 is spaced a sufficient distance above the holding tray 18 to permit the passage of semiconductor crystals beneath the lowest point of the guide tube. The guide tube is mounted in the upper surface of the housing by means of a rubber O-ring 17, or similar gasket, which allows some freedom of movement of the guide tube. The inside diameter of the guide tube is substantially equal to, or greater than, the outside diameter of the solvent metal wire 28 which is to be deposited upon the upper surface 31 of the semiconductor crystal bodies 32.

For purposes of illustration, the operation of the apparatus shown in the drawing will be described with respect to the production of a fused silicon P-N junction in which the semiconductor crystal body is N-type silicon, while the regrown region is P-type. It will be apparent, however, that the operational steps to be described may also be employed for producing fused germanium P-N junctions and P-N junctions in both silicon and germanium bodies in which the semiconductor crystal body is P-type and the regrown region is N-type. In producing a fused P-N junction upon a silicon crystal body by utilizing the apparatus of the present invention, aluminum in the form of aluminum wire is used in the preferred embodiment as a combined solvent metal and active impurity. In addition to being an acceptor impurity, aluminum allows a wide tolerance in the temperatures used in the method and exhibits very little diffusion in the silicon, thereby providing a clearly-defined P-N junction. Although aluminum is used as a combined solvent metal and active impurity in this embodiment, it will be apparent to those skilled in the art that other solvent metals—for example, gold, platinum, silver, and tin—may be used when combined with the proper active impurity.

Referring again to the drawing, in the operation of the apparatus shown, a plurality of silicon crystal bodies 32 which have been previously prepared and crystallographically oriented are positioned upon the quartz holding tray 18. In the present embodiment a tray which is adapted to hold approximately 50 crystals which are square and about ⅛" on a side is used. The fifty silicon crystal bodies are arranged upon the tray in two columns of twenty-five crystals each. Two guide tubes 26 and two aluminum wires 28 are then employed, although one only is shown in the drawing.

After the tray is loaded with silicon crystal bodies, it is positioned upon the rollers 17 in the extreme right hand position as shown in the drawing. Inert gas is then released into the housing and a slightly positive inert atmosphere is maintained throughout the operation of the apparatus. The heating coil 11 is energized and the heating core 10 is raised to a predetermined temperature. The temperature of the heating core will be determined by the rate at which the silicon bodies are processed, as described hereinafter. After the heating core has attained a predetermined temperature, such that the first crystal bodies, that is, those bodies at the left hand end of the quartz holding tray, as shown in the drawing, have attained the desired temperature at their upper surface, the aluminum wire 28 is guided through the guide tubes 26 into contact with the upper surface 31 of the first two silicon crystal bodies 32. In the present embodiment, a temperature of the order of 700° C. at the upper surface of the silicon bodies is used. It is necessary, therefore, that the temperature of the heating core be equal to or greater than 700° C. The exact temperature to be used may be readily determined and is dependent upon the speed at which the semiconductor crystal bodies are moved past the heating core. In the presently preferred embodiment, the temperature of the heating core is of the order of 750° C. and the rate of movement is approximately equal to 0.1 inch per minute. Therefore, approximately two crystals per minute pass the heating core. Upon contact of the aluminum wire with the silicon surface at this temperature, the end portion of the aluminum wire becomes molten and is deposited upon the silicon surface. The motor 22 is started and the holding tray 18 is transported to the left in Fig. 1 at a predetermined rate. Thus, the next two silicon bodies which have been pre-heated due to their proximity to the heating core 10 pass over the immediate area of the heated core and are raised to the temperature of 700° C. Once again, the aluminum wire 28 is guided into contact with the upper surface of the next two silicon bodies. The transport of the holding tray is continuous and is at such a rate that the two silicon bodies which are in the immediate area above the heating core are at the required temperature as they pass through the area. Thus, the aluminum wire is brought into contact with each silicon body as it passes through the heated area. It will be apparent that during the uninterrupted transport, three zones of processing are established. Those crystals which are to the right of the heated core 10 are in the process of being pre-heated and are slowly being elevated in temperature. Those crystals which are immediately above the heated core are at the required temperature and molten aluminum is deposited upon their upper surface. Those crystals which have passed the heating core are cooling at a controlled and gradual rate. As the silicon body cools, the solubility of the silicon in the molten aluminum decreases and, as a result, some of the dissolved silicon, together with some atoms of the aluminum which acts as the acceptor active impurity, begins to precipitate out of the liquid aluminum-silicon solution, depositing preferentially on the N-type silicon body to form a regrown P-type silicon region. The remainder of the aluminum-silicon solidifies as a layer of eutectic aluminum-silicon alloy which is ohmically connected to the P-type regrown region.

It may readily be seen that the method and apparatus described herein lends itself to complete automation in the formation of fused P-N junctions in semiconductor crystal bodies.

Thus, the apparatus and method disclosed herein makes possible an increased rate of production of fused P-N junctions or monatomic semiconductor crystal bodies with a greater degree of efficiency and cleanliness than has heretofore been possible by methods and apparatus of the prior art. In addition, the semiconductor crystal bodies are exposed to elevated temperatures for a minimum length of time, thus yielding semiconductor devices of greater reliability and uniformity.

What is claimed is:

1. An apparatus for forming fused P-N junctions upon the surface of monatomic semiconductor crystal body, comprising: means for producing a localized heating zone, means for continuously passing a plurality of semiconductor crystal bodies through the heating zone at a predetermined rate; means for depositing a mass of solvent metal containing an active impurity upon said surface of said semiconductor crystal body while said body is passing through said heating zone; and means for continuously maintaining an inert atmosphere surrounding said semiconductor crystal bodies.

2. An apparatus for forming fused P-N junctions upon the surface of a monatomic semiconductor crystal body, comprising: means for producing a localized heating zone; means for continuously passing a plurality of semiconductor crystal bodies through the heating zone at a predetermined rate; means for guiding a wire of solvent metal and active impurity to said surface of said semiconductor crystal bodies while said bodies are passing through said heating zone; and means for continuously maintaining an inert atmosphere surrounding said semiconductor crystal body.

3. An apparatus for forming fused P-N junctions upon the surface of a monatomic semiconductor crystal body, comprising: a housing; a heating core within said housing; a holding tray for positioning a plurality of semiconductor crystal bodies, said holding tray being mounted within said housing above and longitudinally movable past said heating core; means for longitudinally moving said holding tray at a predetermined rate past said heating core; means for guiding a wire of solvent metal and active impurity into said housing above said heating core; and means for maintaining an inert atmosphere in said housing.

4. An apparatus for forming fused P-N junctions upon the surface of a monatomic semiconductor crystal body, comprising: a housing; a localized heat source within said housing, said heat source being a graphite heating core surrounded by a resistance heating coil, a source of electrical power for said heating coil; a holding tray for positioning a plurality of semiconductor crystal bodies upon the upper surface of said tray, said holding tray being slideably mounted within said housing above said heat source, said holding tray being substantially greater in area than the area of said heating core, the lower surface of said holding tray being proximate and parallel to the upper surface of said heating core; means for longitudinally moving said tray at a predetermined rate past said heating core; at least one guide tube moveably mounted in, and extending through, a wall of said housing; said guide tube having an open end proximate the upper surface of said holding tray above said heating core, said guide tube having an inside diameter substantially equal to the outside diameter of a wire of solvent metal and active impurity; and means for maintaining an inert atmosphere in said housing.

5. An apparatus for forming fused P-N junctions upon the surface of a monatomic semiconductor crystal body, comprising: a housing, said housing having a transparent section in at least one surface thereof; a localized heat source within said housing, said heat source being a graphite heating core surrounded by a resistance heating coil, a source of electrical power to said heating core; a holding tray for positioning a plurality of semiconductor crystal bodies upon the upper surface of said tray, said holding tray being a quartz tray substantially greater in area than the area of the upper surface of said heating core, said holding tray being moveably mounted within said housing above said heat source, the lower surface of said holding tray being proximate, and parallel to, the upper surface of said heating core; a shaft affixed to said holding tray parallel to the path of movement of said tray extending through a wall of said housing, a rack gear affixed to said shaft at a substantial distance from the outside surface of said housing, an electric motor coupled to said rack gear through a reduction gear for moving said tray at a predetermined and controlled rate past said heating core; at least one guide tube moveably mounted in, and extending through, a wall of said housing, said guide tube being a quartz tube having an open end proximate the upper surface of said holding tray above said heating core, said quartz tube having an inside diameter substantially equal to the outside diameter of a wire of solvent metal and active impurity; and means for maintaining an inert atmosphere in said housing.

References Cited in the file of this patent

UNITED STATES PATENTS

| | | |
|---|---|---|
| 2,192,743 | Howe | Mar. 5, 1940 |
| 2,216,519 | Quarnstrom | Oct. 1, 1940 |
| 2,629,672 | Sparks | Feb. 24, 1953 |